(12) United States Patent
Dalla Piazza et al.

(10) Patent No.: US 7,112,914 B1
(45) Date of Patent: Sep. 26, 2006

(54) PIEZOELECTRIC RESONATOR AND ASSEMBLY COMPRISING THE SAME ENCLOSED IN A CASE

(75) Inventors: Silvio Dalla Piazza, St-Imier (CH); Bruno Studer, Riedholz (CH); Thomas Luethi, Grenchen (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 11/148,438

(22) Filed: Jun. 9, 2005

(51) Int. Cl.
*H01L 41/08* (2006.01)
(52) U.S. Cl. .................. 310/348; 310/344; 310/370
(58) Field of Classification Search ............... 310/348, 310/370, 344
See application file for complete search history.

(56) References Cited

U.S. PATENT DOCUMENTS

| | | | |
|---|---|---|---|
| 4,920,296 A * | 4/1990 | Takahashi et al. | 310/348 |
| 5,841,217 A * | 11/1998 | Kizaki et al. | 310/348 |
| 5,969,461 A * | 10/1999 | Anderson et al. | 310/313 R |
| 6,700,313 B1 * | 3/2004 | Dalla Piazza et al. | 310/370 |
| 6,960,868 B1 * | 11/2005 | Ishimasa et al. | 310/324 |
| 2003/0067248 A1 | 4/2003 | Piazza et al. | |
| 2004/0085163 A1 | 5/2004 | Kikushima | |
| 2005/0062368 A1 | 3/2005 | Hirasawa et al. | |

* cited by examiner

*Primary Examiner*—Mark Budd
(74) *Attorney, Agent, or Firm*—Sughrue Mion, PLLC

(57) ABSTRACT

The invention concerns an assembly comprising a piezoelectric resonator and a case, said case including a main part with a bottom and sides, in which said resonator is mounted and a cover fixed to said main part, said resonator including a tuning fork shaped part with two parallel vibrating arms connected to each other by a linking part, and a central arm protruding from said linking part and located between both vibrating arms carrying at least two electrodes to make them vibrate, these two electrodes being connected respectively to at least first and second connection pads located on a back face of said central arm oriented toward the bottom of the case, said case further comprising at least one support secured to its bottom on which said central arm of the resonator is fixed by means of at least first and second connection elements located on said support and electrically connected respectively to said first and second connection pads by a conductive adhesive, wherein guiding means are provided at least with either said first connection pad or element being located on the linking part side in order to flow excess of said conductive adhesive away from the second electrode being not electrically connected to said first connection pad or element with said guiding means.

15 Claims, 12 Drawing Sheets

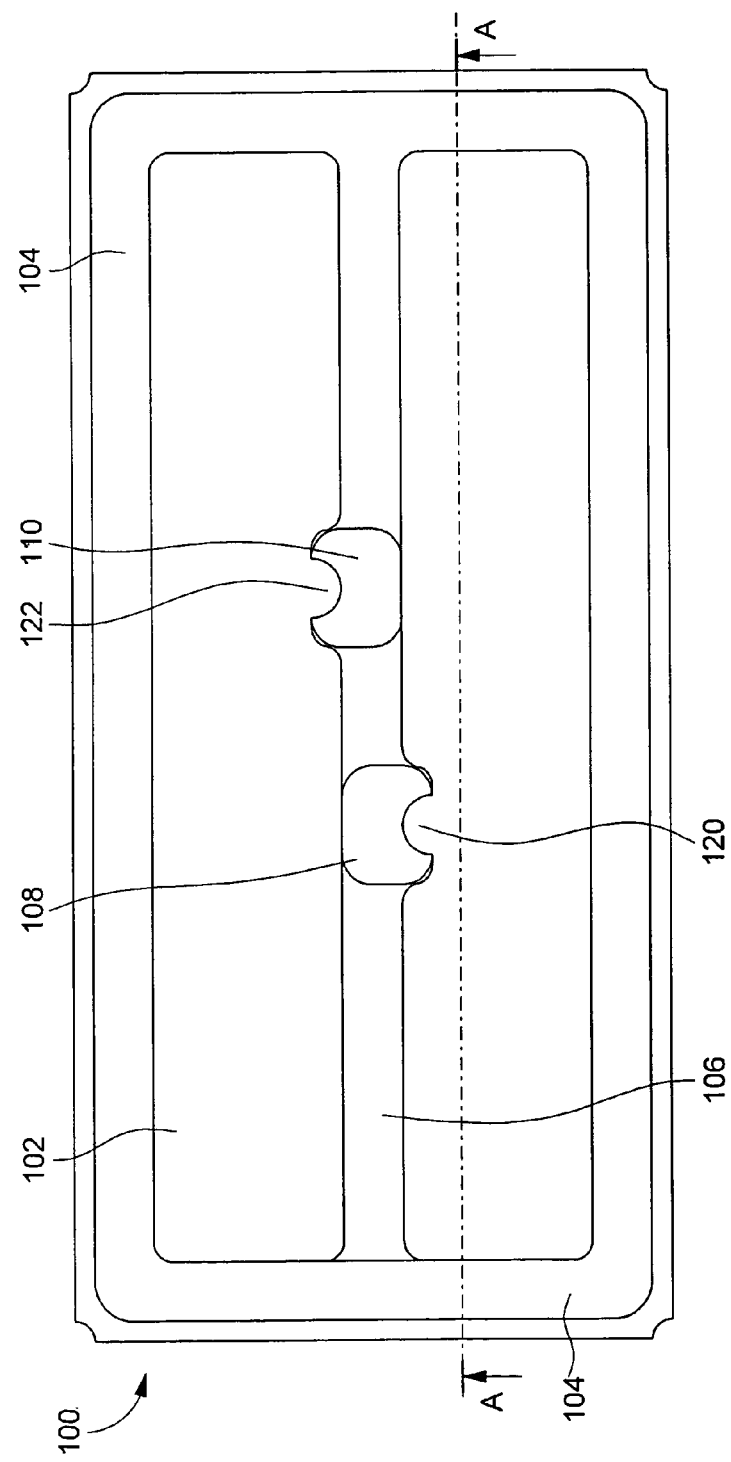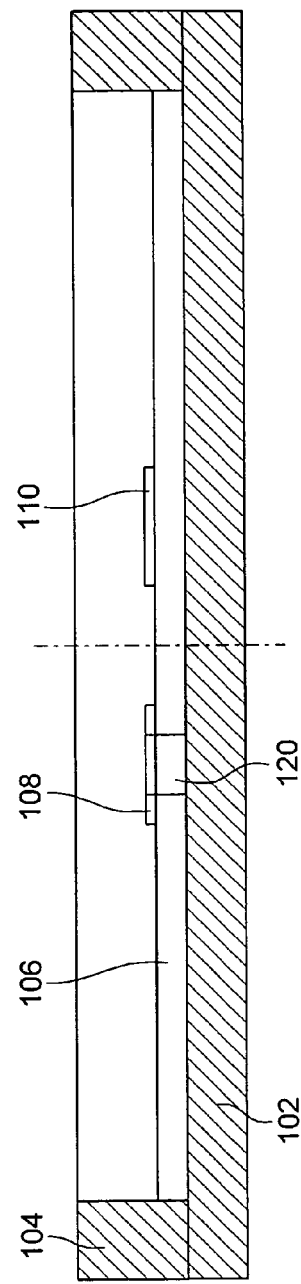

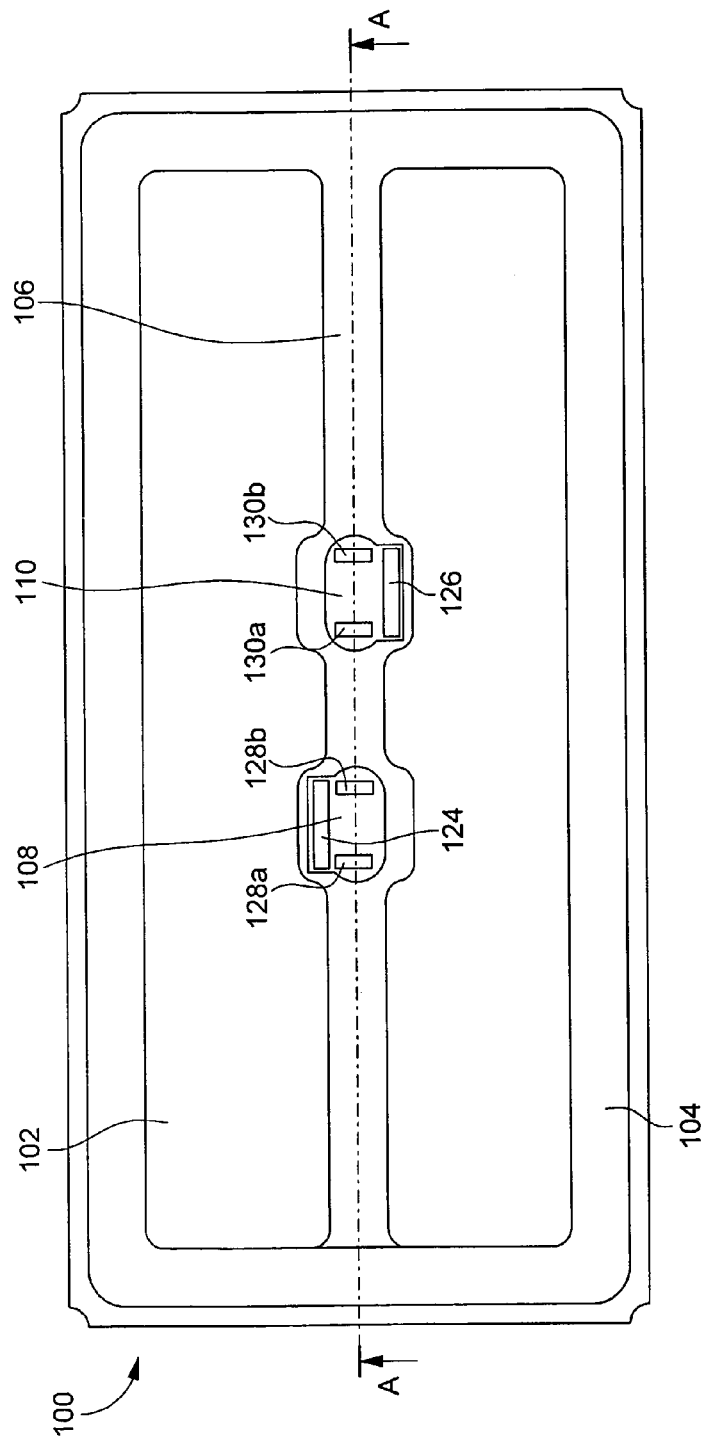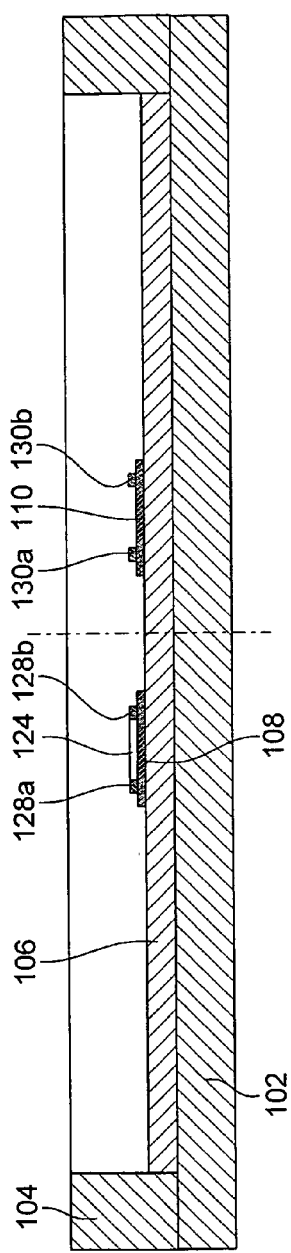
Fig. 3a
Fig. 3b

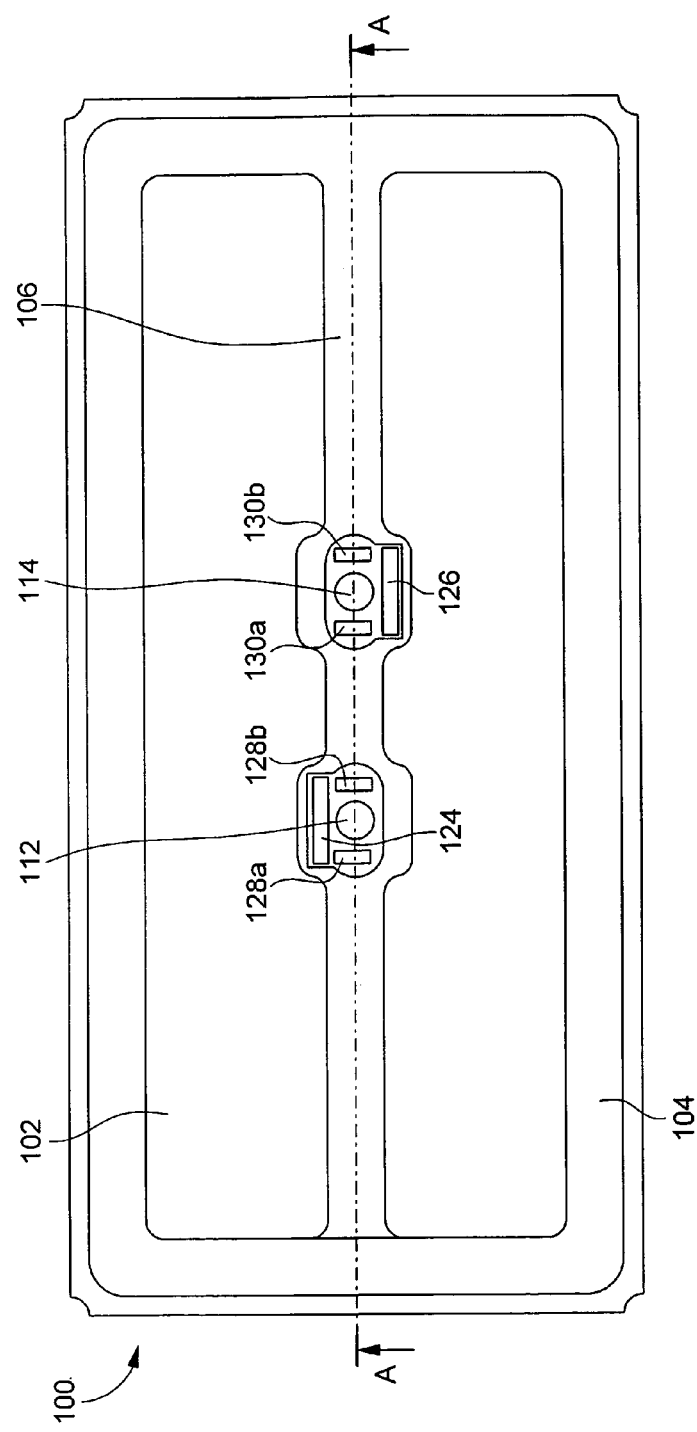
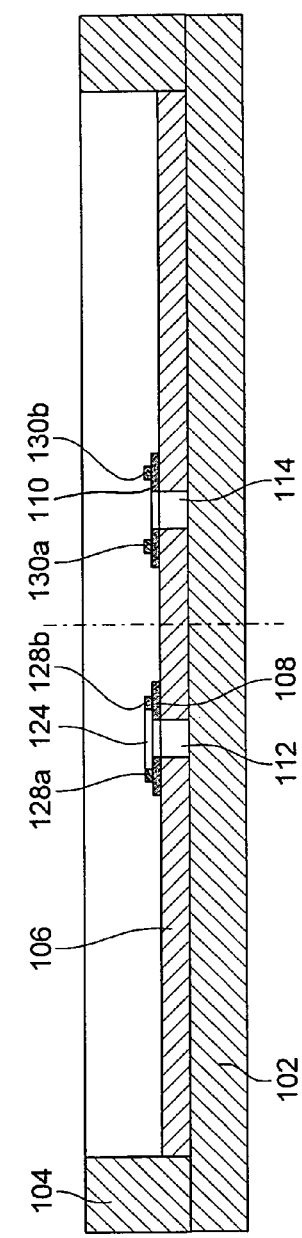
Fig. 4a
Fig. 4b

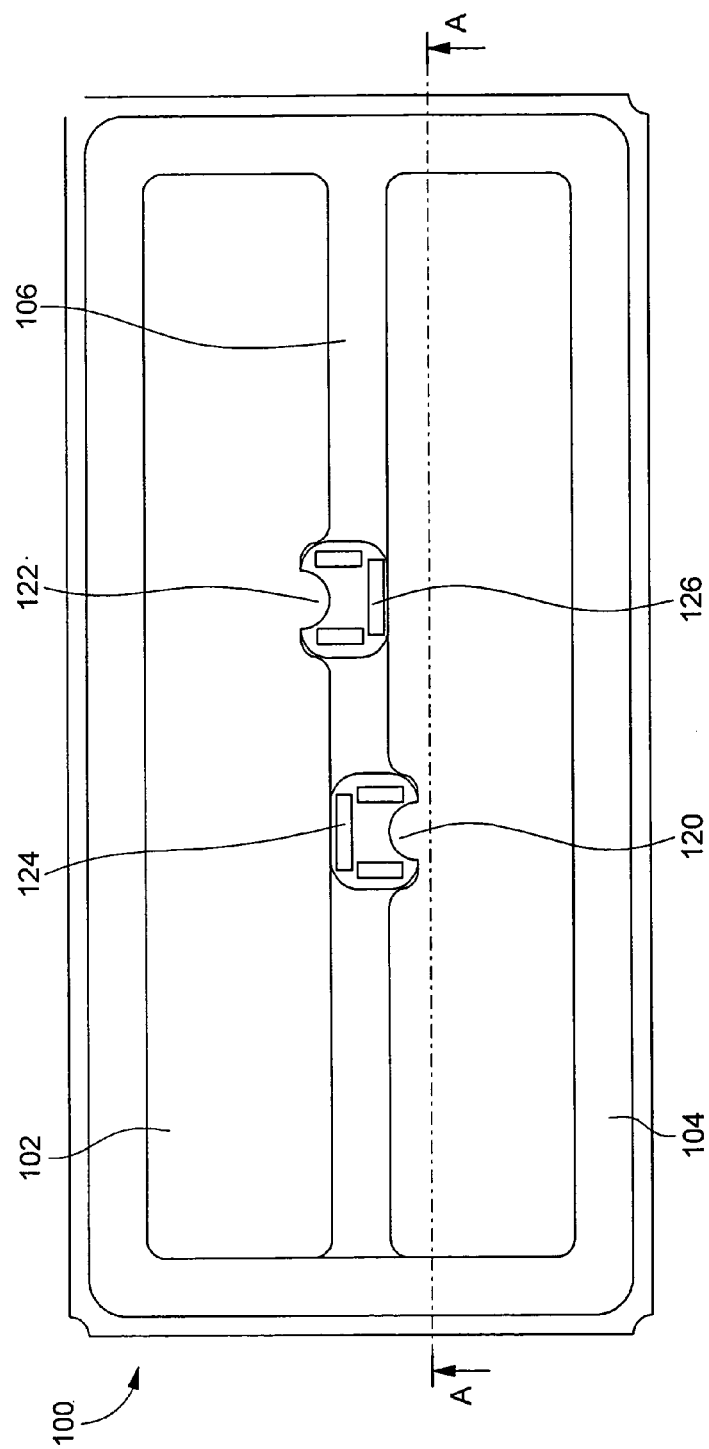
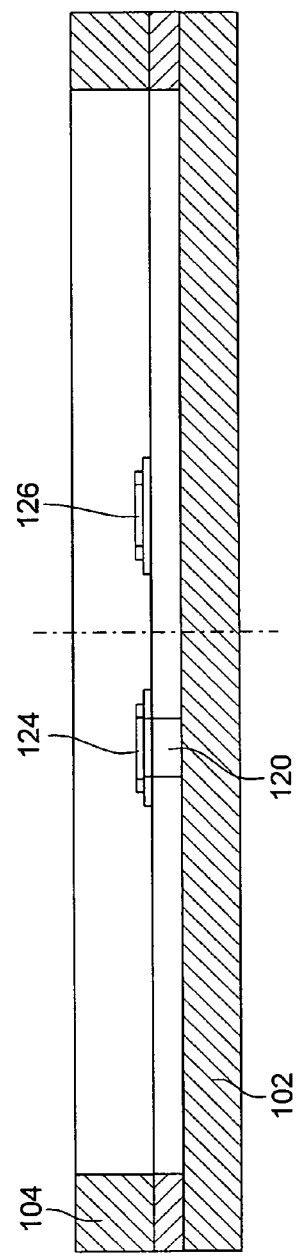
Fig. 5a
Fig. 5b

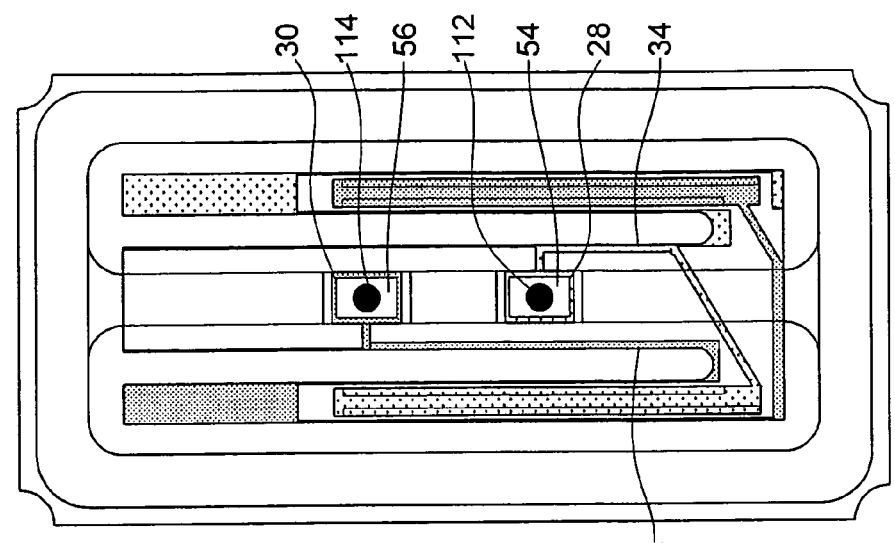
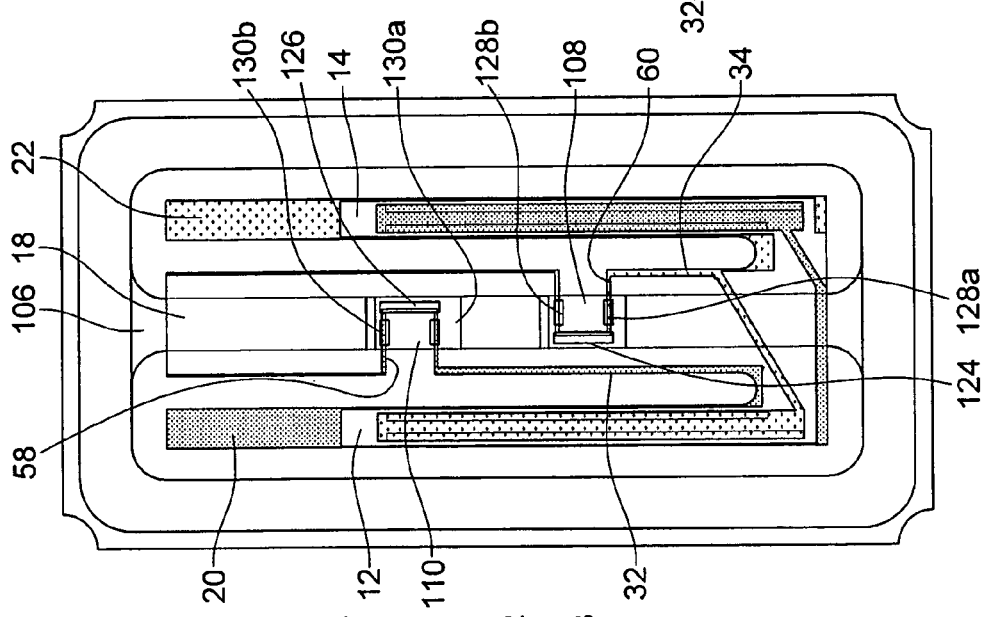
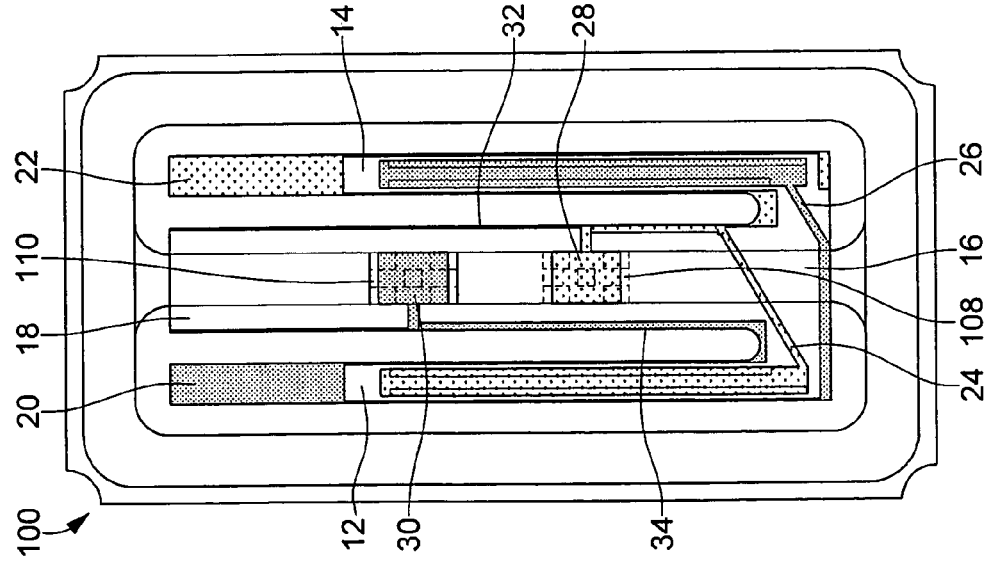
Fig. 10c
Fig. 10b
Fig. 10a

PIEZOELECTRIC RESONATOR AND ASSEMBLY COMPRISING THE SAME ENCLOSED IN A CASE

FIELD OF INVENTION

The present invention concerns piezoelectric resonators and more particularly resonators of small dimensions which are most often used for making frequency generators in particular for portable electronic equipment, in numerous fields such as horology, information technology, telecommunications and the medical field.

BACKGROUND OF THE INVENTION

Such a resonator of small dimensions has been disclosed in the prior art document U.S. Pat. No. 6,700,313 filed in the name of the name Assignee, which is enclosed herewith by way of reference. Resonator 10 represented on FIG. 12, which is intended to be mounted in a case, includes a tuning fork shaped part with two parallel arms 12, 14 connected to each other by a linking part 16 and carrying electrodes 20, 22 to make them vibrate, these electrodes being connected to connecting pads 28, 30 intended to be electrically connected to the exterior of the case. Resonator 10 also includes a central arm 18 attached to linking part 16 and located between arms 12, 14 of the tuning fork shaped part, substantially equidistant from them, this central arm 18 having a greater mass than that of the arms of the tuning fork shaped part and connected pads 28, 30 are carried by this central arm. This resonator is mounted in a case of parallelepiped shape by fixing its central arm 18 to at least one support secured to the bottom of the case.

The above described kind of resonators, called hereinafter three arm resonators, allows breaking away from many problems encountered with conventional tuning fork resonators.

One of these problems is that the dimensional and functional features of the conventional tuning fork resonators are optimised for mounting them in metallic cases and not in ceramic cases. For example, the ratio between their length and their width is ill suited to the manufacture of such cases, in particular when the cases are of the SMD (Surface Mounting Device) type, i.e. meant to be automatically mounted on hole-free printed circuit boards. Because of this, a conventional tuning fork resonator and its connection to the case do not have very good resistance to shocks.

Further conventional tuning fork resonators are liable to tip towards the bottom of the case when it is fixed onto a step of the case.

Furthermore, since the thermal expansion coefficients of ceramic material and quartz are different enough to create mechanical stresses in the resonator which can not only be felt in the arms of the tuning fork and disturb the working of the resonator when the temperature changes but can also break the solder or detach connection pads of the resonator from those of the case and alter or even cut the electric connection between the resonator electrodes and the external contact pads of the case.

For the same reason, if there is an incipient fracture on the side of base of the tuning fork where connection pads are situated, a significant temperature variation can even break the tuning fork.

Finally, when the resonator is vacuum packed, the vacuum is never perfect and the stirring of the atmosphere by the tuning fork arms when the resonator vibrates can modify the operating parameters of the resonator when its arms come close to each other, more so than in the case of a metallic case.

Thus, three arm resonators enable satisfactory solutions to be brought to the various problems posed by conventional tuning fork resonators. Nevertheless although these three arm resonators have proved to be advantageous, it implies a permanent concern for one skilled in the art for accurately mounting the resonator inside its packaging in order to prevent any leakage when gluing said resonator to the support provided on the bottom of the case which may cause short-circuit between electrodes arranged on the central arm. As shown on FIG. 9, which is an enlarged cut view of the "gluing zone" between conductive pads 28 and 30 and corresponding conductive elements 108 and 110 of the package. Conductive adhesive 136 leaks under pressure when mounting the resonator inside the package and may provoke short-circuit between the electrodes (not shown) located on the back face of central arm 18.

SUMMARY OF THE INVENTION

The main goal of the present invention is to overcome the aforecited drawbacks by providing a three arm resonator along with its packaging which in combination enables to mount the resonator securely inside its packaging while preventing short-circuit between the electrodes on the central arm of the resonator due to conductive adhesive leakage.

For that purpose, according to a first aspect of the invention, it concerns an assembly comprising a piezoelectric resonator and a case, the case including a main part with a bottom and sides, in which the resonator is mounted and a cover fixed to the main part, the resonator including a tuning fork shaped part with two parallel vibrating arms connected to each other by a linking part, and a central arm protruding from the linking part and located between both vibrating arms carrying at least two electrodes to make them vibrate, these two electrodes being connected respectively to at least first and second connection pads located on a back face of said central arm oriented toward the bottom of the case, the case further comprising at least one support secured to its bottom on which the central arm of the resonator is fixed by means of at least first and second connection elements located on the support and electrically connected respectively to the first and second connection pads by a conductive adhesive, wherein guiding means are provided at least with either the first connection pad or element being located on the linking part side in order to flow the conductive adhesive away from the second electrode being not electrically connected to the first connection pad or element with the guiding means. Thus this guiding means allow preventing short-circuit between electrodes on the central arm of the resonator.

According to another aspect of the invention, the guiding means include a hole in the support through the first connection element which hole allows the excess of conductive adhesive to flow into it when gluing the resonator on the support.

According to another aspect of the invention, the guiding means include a recess cut in the support in the gluing zone of the first connection element and on the opposite side to the second electrode, which recess allows the excess of conductive adhesive to flow toward it when gluing the resonator on the support.

According to another aspect of the invention, the guiding means include at least one first bump arranged along either the first connection element or pad between the latter and the second electrode which bump prevents the excess of conductive adhesive from flowing toward the second electrode when gluing the resonator on the support.

According to another aspect of the invention, the guiding means, in addition to a first bump arranged along either the first connection element or pad, further include two other bumps arranged orthogonally to the first bump and along lateral sides of the first connection element or pad. This U-shaped barrier efficiently prevents the excess of conductive adhesive from flowing toward the second electrode when gluing the resonator on the support.

According to another aspect of the invention, the guiding means are provided with both the first connection pads or elements and the second connection pads or elements. This symmetric arrangement prevents from having a different spreading of the conductive adhesive in the respective gluing zones of the first and second connection elements when gluing the resonator on the support.

According to another aspect of the invention, an opening through the first connection pad has been provided for positioning said resonator into said case. Such an opening further allows injecting the conductive adhesive in such a way that the excess of adhesive flows away from the second electrode when gluing the resonator on the support.

The invention also concerns a method for securing a piezoelectric resonator in a case of an assembly according to any of the previous aspects of the invention.

BRIEF DESCRIPTION OF THE DRAWINGS

Other features and advantages of the invention will appear upon reading the following description which refers to the annexed drawings in which:

FIGS. 2a and 2b are respectively top and cut views of an opened package for receiving a piezoelectric resonator according to a second embodiment of the invention;

FIGS. 3a and 3b are respectively top and cut views of an opened package for receiving a piezoelectric resonator according to a third embodiment of the invention;

FIGS. 4a and 4b are respectively top and cut views of an opened package for receiving a piezoelectric resonator according to a fourth embodiment of the invention;

FIGS. 5a and 5b are respectively top and cut views of an opened package for receiving a piezoelectric resonator according to a fifth embodiment of the invention;

FIGS. 10a, 10b and 10c are respectively three variants of assembly including a resonator mounted in a package according to three of the previous embodiments;

DETAILED DESCRIPTION OF THE INVENTION

Figure 1A:
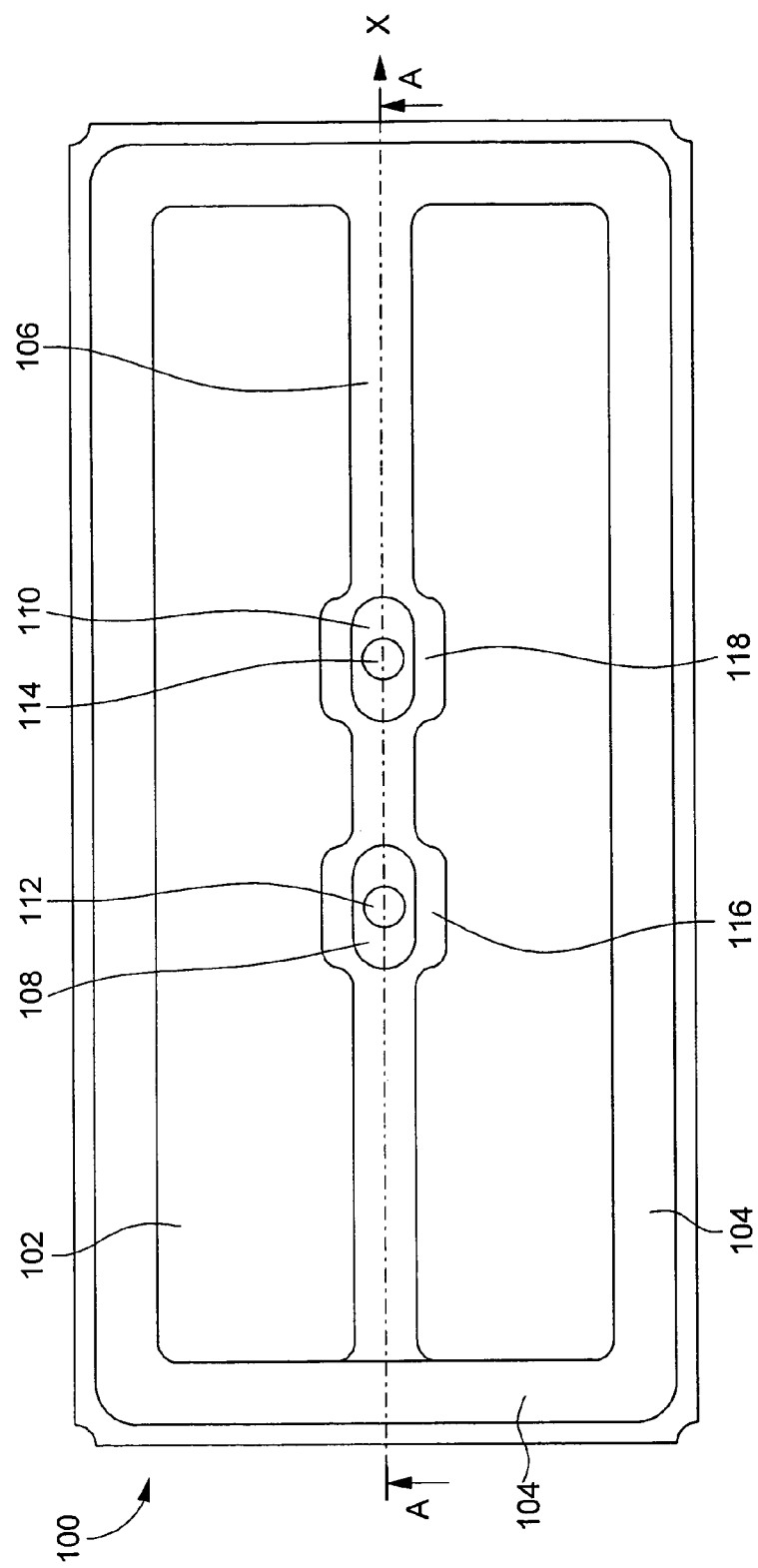
FIGS. 1a and 1b are respectively top and cut views of an opened package for receiving a piezoelectric resonator according to a first embodiment of the invention.
Figure 1B:
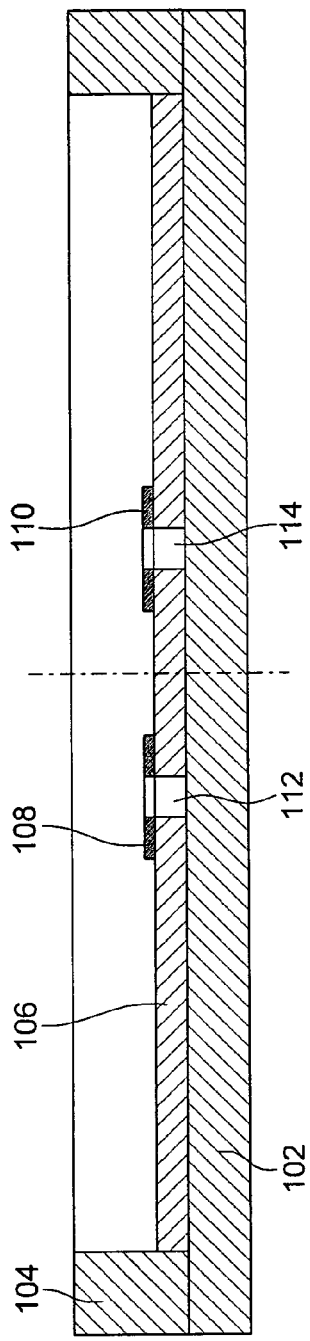

According to a first embodiment of the invention, it is shown in relation with FIGS. 1a and 1b, top and cut views of an opened package without its cover for receiving a piezoelectric resonator. It is understood that the size and shape of the packaging is adapted to the resonator structure (not shown). Case 100 of parallelepiped shape includes a main part formed by a flat bottom 102 and four sides 104 and a cover with an edge (not shown) via which the cover is vacuum soldered, on sides 104 of the main part, by heating and pressure, by means of a soldering frame (also not shown), after the resonator has been mounted in case 100. Additionally, a support has been arranged on bottom 102 of case 100, which support is preferably in the form of a rib 106 extending along the longitudinal axis X in order to support fixing parts of the resonator. The rib width is chosen so that vibrating arms of the resonator may vibrate freely inside case 100 as it appears more clearly on FIG. 10c. On rib 106 two conductive elements, such as thin conductive layers 108 and 110, are arranged for contacting the corresponding conductive pads of the resonator. It will be appreciated that rib 106 shall not extend from one side 104 to the opposite one.

Further, in order to prevent leakage of the conductive adhesive when gluing the resonator into the package, guiding means are provided at least with one conductive element and preferably both elements 108 and 110. According to the first embodiment of the invention, these guiding means are holes 112, 114 cut through conductive layers 108 and 110 and at least partly through rib 106. Preferably, rib 106 is further provided with wider portion 116, 118 at least on both sides of conductive elements 108, 110 in order to assure a better support for the resonator.

According to a second embodiment shown in relation of FIGS. 2a and 2b, the guiding means are implemented in the form of recesses 120 and 122 respectively cut in conductive elements 108 and 110 and in support 106 on the opposite side from the one where the electrode arranged on the central arm of the resonator is located, as it will be described hereinafter in relation with FIG. 10c.

According to a third embodiment shown in relation with FIGS. 3a and 3b, the guiding means include bumps 124 and, preferably, 126 respectively arranged along connection elements 108 and 110 in order to be located between the latter and the electrode located on the back face of the central as it will be shown in FIG. 10b. Alternatively, these bumps may be provided on the back face of the resonator instead on support 106. These bumps 124 and 126 advantageously extend on the whole length of the conductive elements (or pads for the alternative on the resonator). Furthermore, additional bumps 128a and 128b, respectively 130a and 130b, substantially perpendicular to bump 124, respectively 126, have been provided on conductive element 108, respectively 110 (or alternatively on connecting pads of the resonator). Thus the three bumps 124, 128a and 128b, respectively 126, 130a and 130b, form a U-shaped barrier that efficiently prevents the excess of conductive adhesive from flowing towards the electrode located on the resonator central arm.

According to a fourth embodiment of the invention shown in relation with FIGS. 4a and 4b, the guiding means include both holes 112 and 114 as in the first embodiment and bumps 124 and 126 and preferably bumps 128a, 128b, 130a and 130b as in the third embodiment.

According to a fifth embodiment of the invention shown in relation with FIGS. 5a and 5b, the guiding means include both recesses 120 and 122 as in the second embodiment, and bumps 124 and 126, and preferably bumps 128a, 128b, 130a and 130b as in the third embodiment.

Figure 6:
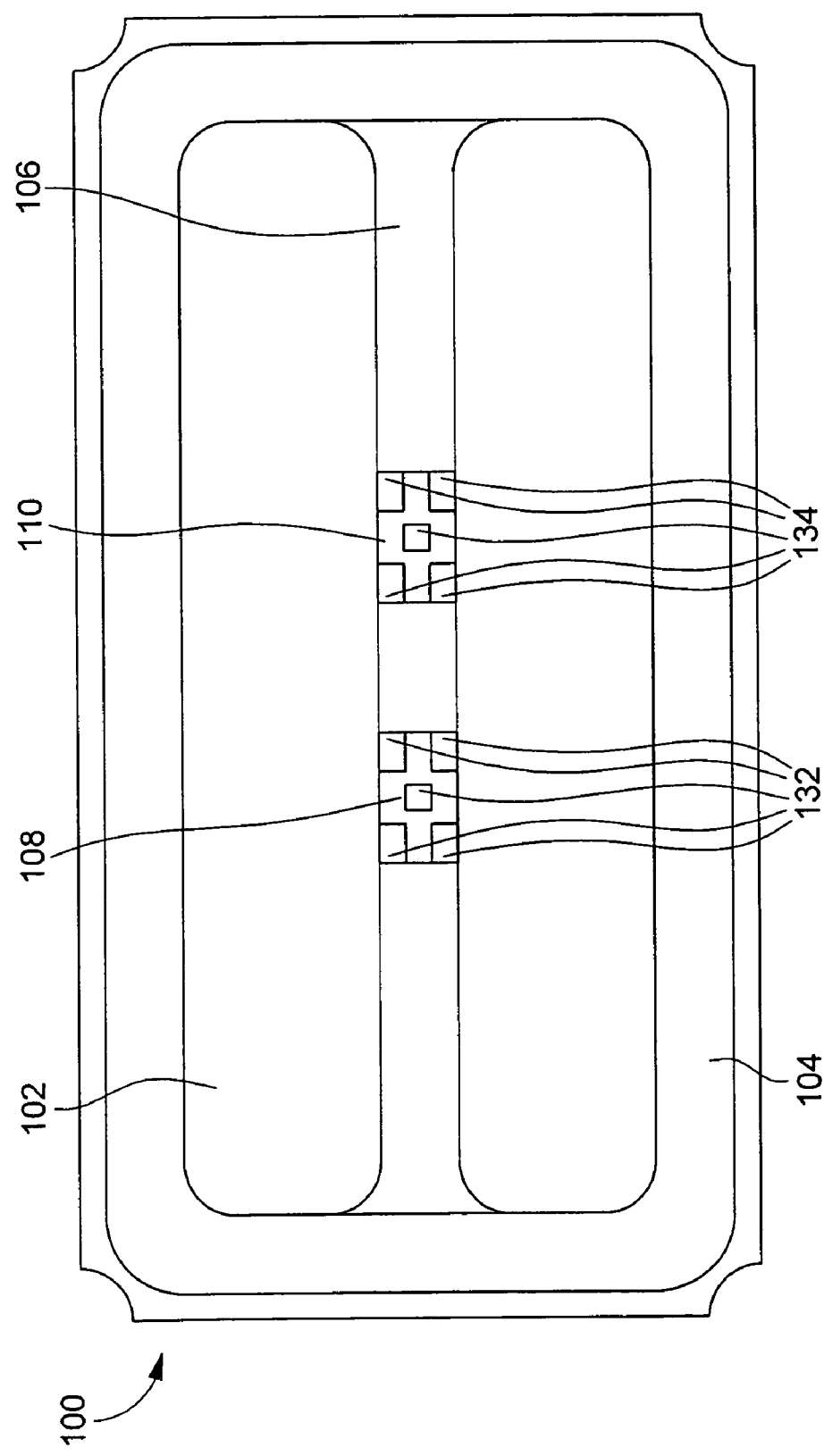
FIG. 6 is a top view of an opened package for receiving a piezoelectric resonator according to a sixth embodiment of the invention.

According to a sixth embodiment of the invention shown in relation with FIG. 6, the guiding means include two sets of bumps 132 and 134, respectively arranged on conductive elements 108 and 110, or alternatively on connection pads of the resonator. Each set of bumps preferably comprises five bumps distributed in the following manner, one bump being located in each corner of the corresponding connection element or alternatively of the corresponding connection pad and a fifth one being located in the middle of the four other bumps. This set of bumps configuration assures a uniform repartition of the conductive adhesive and therefore reduce unwanted leakage towards the electrode of the central arm as it will be detailed in relation with FIG. 10a.

Figure 7:
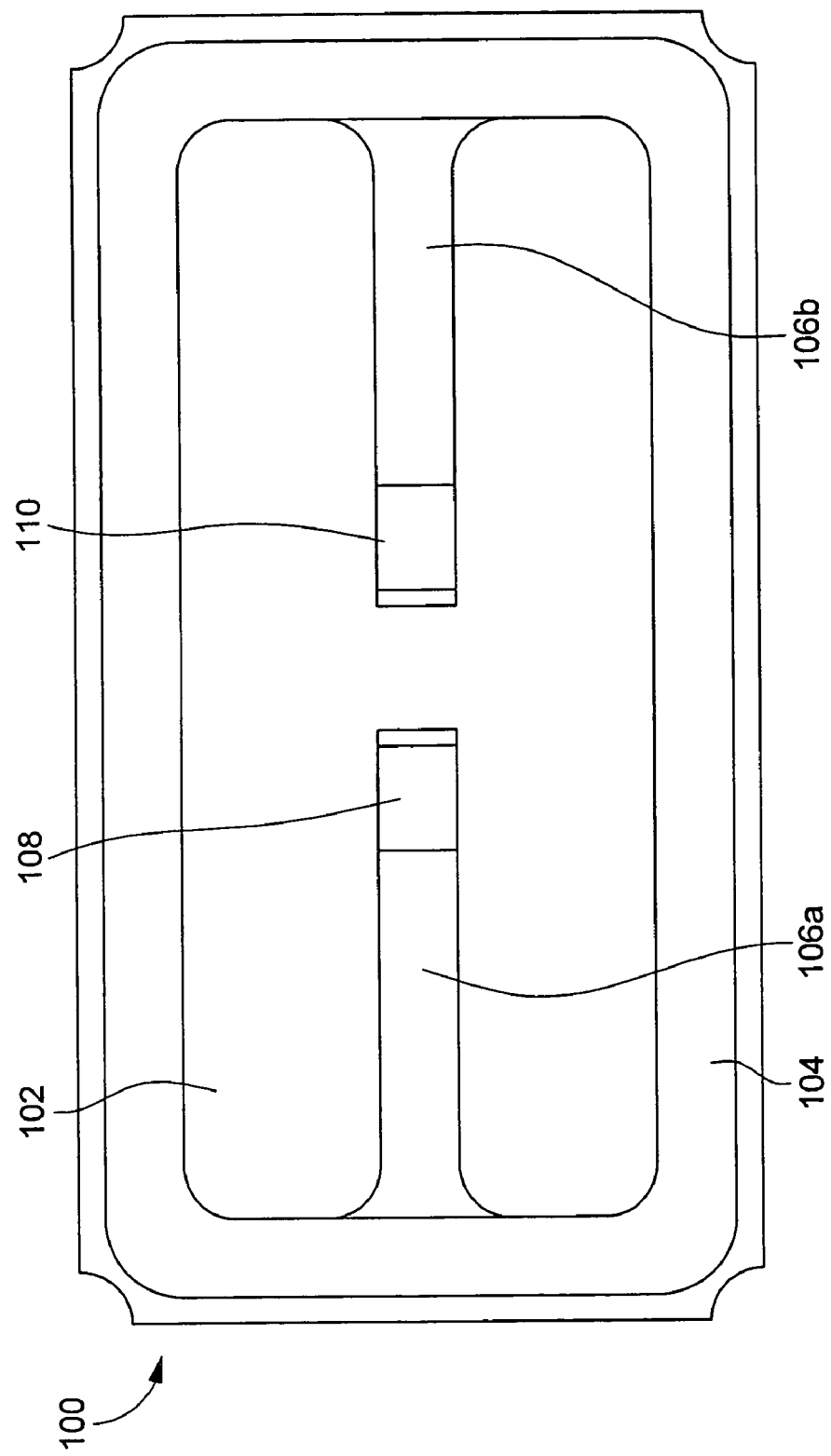
FIG. 7 is a top view of an opened package for receiving a piezoelectric resonator according to a seventh embodiment of the invention.

FIG. 7 shows a package 100 according to a seventh embodiment of the invention, which differs from the previous embodiments in that the support piece, arranged on the bottom 102 of the case, is divided in two parts 106a and 106b, leaving a hollow space between both supported conductive elements 108 and 110. This hollow space 106c further prevents short-circuits between the two conductive elements that may occur during gluing due to leakage of the excess of conductive adhesive.

Figure 8:
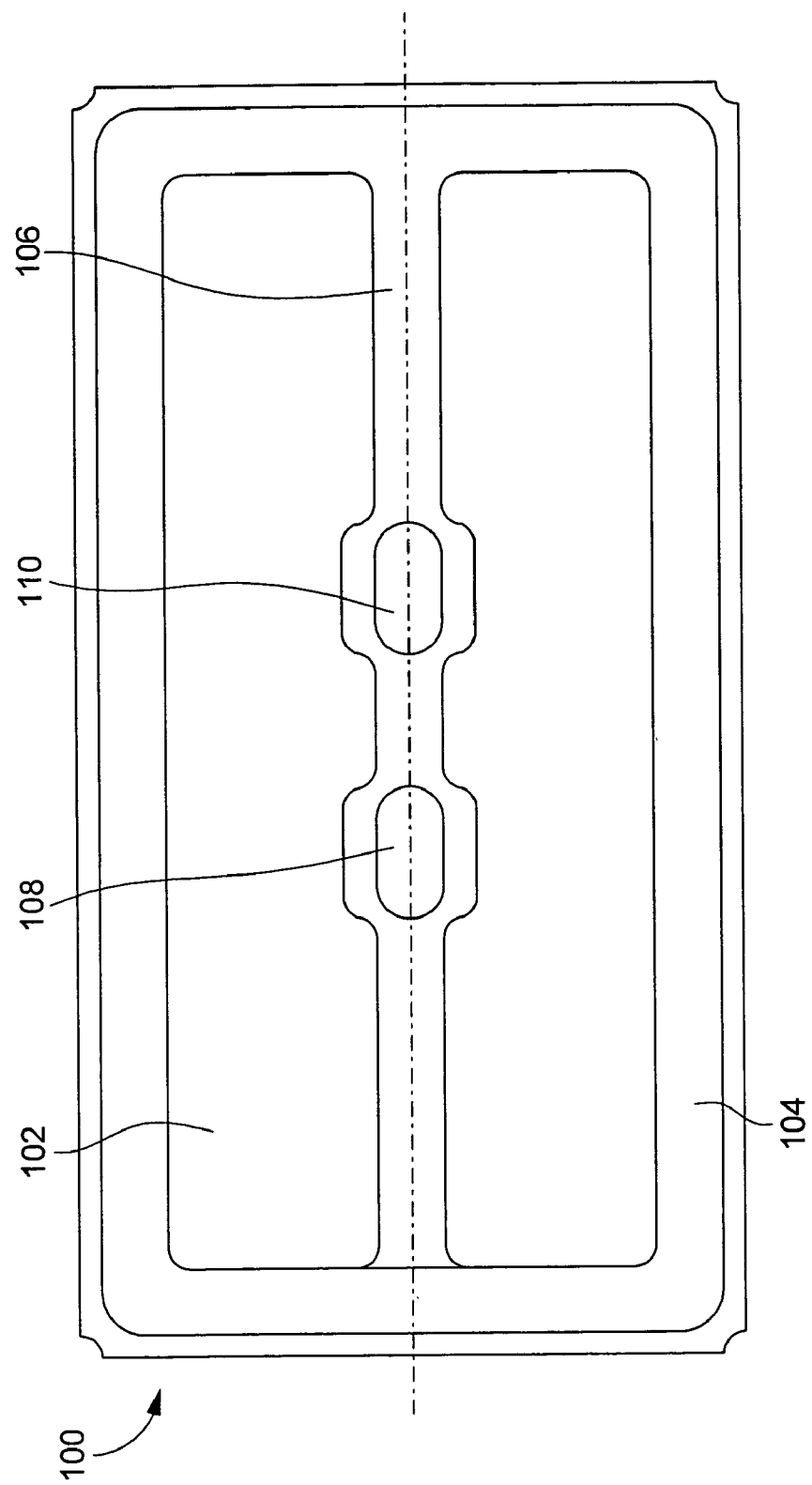
FIG. 8 is a top view of an opened package for receiving a piezoelectric resonator according to an eighth embodiment of the invention.
Figure 9:
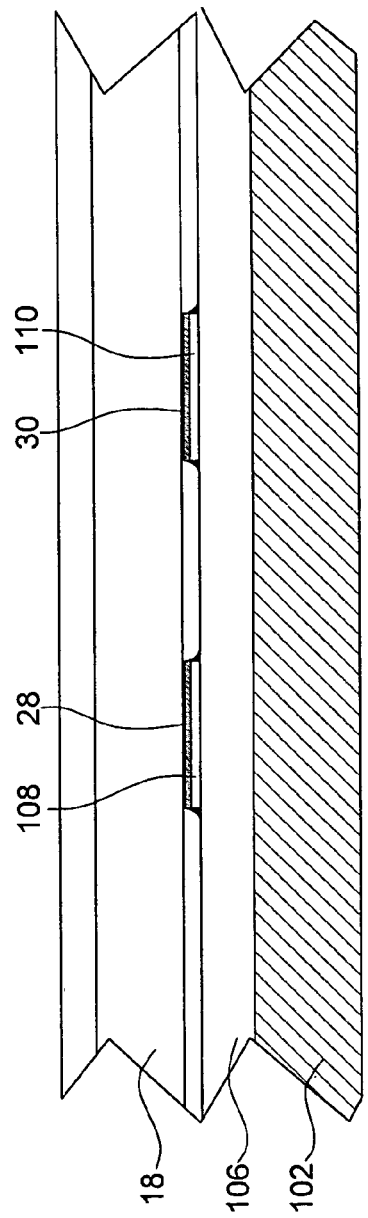
FIG. 9 is an enlarged cut view of the gluing zone between the resonator and the package according to the prior art.

FIG. 8 shows a package 100 according to an eighth embodiment of the invention that may be used with all above described alternatives wherein bumps are provided on the central arm of the resonator. According to this embodiment, only conductive layers 108 and 110 are provided on rib 106.

FIG. 10a shows a first variant of an assembly including a resonator mounted in a package according to the sixth embodiment. Resonator 10 comprises vibrating arms 12 and 14 which carry two groups of electrodes 20 and 22, which are connected to each other by conductive paths respectively 24 and 26 (shown by transparency), carried by linking part 16 of the tuning fork shaped part. These electrodes and conductive paths are disposed to make arms 12 and 14 vibrate in flexure mode, but they could have a different configuration to make the arms vibrate in the same mode or another mode (torsion, shear, etc.). Returning to the back face of central arm 18, two conductive connection pads 28 and 30 (shown by transparency) are located on either side of the centre of gravity G of the resonator lengthways and preferably equidistant from it, these pads 28 and 30 being connected by conductive paths 32 and 34 (also shown by transparency) respectively to conductive paths 26 and 24 which connect the electrodes of each group 20 and 22 to each other. These pads 28 and 30 may also be used for fixing the resonator inside its packaging 100 by gluing them with a conductive adhesive to connection elements 108 and 110.

In order to reduce consumption of energy by producing an excitation electrical field which is more homogeneous and locally more intense and for which vibration loss at the arms is low even when the size of the vibrating piece is miniaturized, at least one groove is formed on at least one of a front side and a rear side of each vibrating arm.

Still on FIG. 10a, as shown by transparency through central arm 18, package 100 is according to the sixth embodiment. Sets of bumps are provided on connection elements 108 and 110 and therefore assure when gluing the resonator on rib 106 that the conductive adhesive is spread in a uniform manner so that it reduces unwanted leakage towards electrode path 32 which connects electrode 22 to connecting pad 30.

FIG. 10b shows a second variant of an assembly including a resonator mounted in a package according to the third embodiment. The resonator shown differs from the one of FIG. 10a in that fixing and positioning means are arranged on central arm 18. According to this second variant, it guarantees an accurate positioning and a robust fixing of resonator 10 inside its packaging 100 by the means of fixing and positioning recesses 58 and 60 which have been cut on both sides of central arm 18 facing both vibrating arms 12, 14 of the resonator. These recesses 58, 60 have been cut through the whole depth of central arm 18 and thus allow accurate positioning in the packaging with respect to conductive elements 108 and 110 made on rib 106 and visible through said recesses. It will be appreciated that recesses 58, 60 may have several shapes, such as square, circle or polygonal ones.

Still on FIG. 10b, as shown by transparency through central arm 18, package 100 is according to the third embodiment. Bumps 124 and, preferably, 126 respectively are arranged along connection elements 108 and 110. Additional bumps 128a and 128b, respectively 130a and 130b, substantially perpendicular to bump 124, respectively 126, are preferably provided. Thus the three bumps 124, 128a and 128b form a U-shaped barrier that efficiently prevents when gluing that the excess of conductive adhesive flows towards the electrode path 32 which connects electrode 22 to connection element 30.

FIG. 10c shows a third variant of an assembly including a resonator mounted in a package according to the first embodiment. The resonator shown differs from the one of FIG. 10b in that the fixing and positioning means arranged on central arm 18 are fixing and positioning holes 54 and 56 which have been cut through central arm 18. Since these holes 54 and 56 have been cut through central arm 18, one may accurately positioned resonator 10 inside the packaging by looking to these connection elements located on rib 106. During the assembly of the resonator inside its packaging, holes 54, 56 are filled in with conductive glue that allows on the one hand electrically connecting electrodes 20, 22 to the conductive elements and on the other hand solidly fixing resonator 10 inside its packaging. It will be appreciated that holes 54, 56 may have several shapes, such as square, circle or polygonal ones.

Still on FIG. 10c, as shown through holes 54 and 56, package 100 is according to the first embodiment. Holes 112, 114 are cut through conductive layers 108 and 110 and at least partly through rib 106 in order to prevent leakage of the conductive adhesive towards electrode path 32 when gluing the resonator into the package. In fact excess of the conductive adhesive flows in holes 112, 114. This also applies in the same manner for the second embodiment with recesses instead of holes.

As an alternative to the variants of FIGS. 10b and 10c, one may provide with blind holes located on the back face of the central arm, i.e. the one supporting conductive elements 28 and 30. Positioning of the resonator can then be made by guiding these blind holes along corresponding bumps in the case as it will be more detailed in relation with FIG. 11f.

It will be appreciated that these three variants have been given only by way of non limiting examples between all possible combinations of resonators and package according to any of the preceding embodiments.

FIGS. 11a to 11f show enlarged cut views of the gluing zone between connecting elements 108 and 110 and corresponding connecting pads 28 and 30 according to some of the previous embodiments of the invention. The method for securing the piezoelectric resonator inside its case comprises the following steps:

gluing connection pads 28 and 30 to corresponding connection elements 108 and 110 with a conductive adhesive;

guiding away the excess of conductive adhesive from the electrode path 32 (not visible on these Figures) by guiding means.

A preliminary step consisting of positioning the resonator into the case by seeing the guiding means through the opening an opening through one connection pad may be implemented with respect to the examples shown in relation with FIGS. 11a, 11b, 11d and 11e.

Figure 11A:
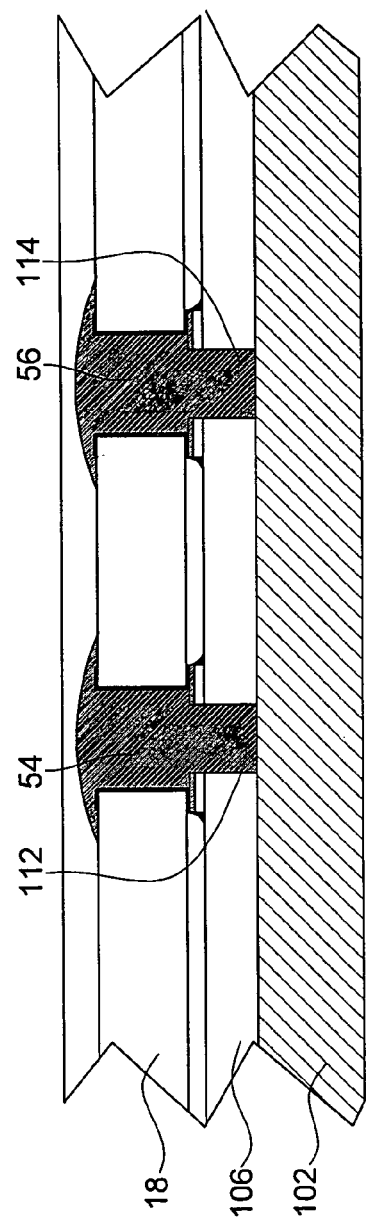
FIGS. 11a to 11f are enlarged cut views of the gluing zone between the resonator and the package according to five different embodiments of the invention.

FIG. 11a shows an enlargement of an assembly of a resonator having holes 54 and 56 on its central arm 18 and a package according to the first embodiment. When gluing, one fills in holes 54 and 56 with a conductive adhesive which excess flows inside holes 112 and 114 and thus prevents from short-circuit with the other electrode.

Figure 11B:
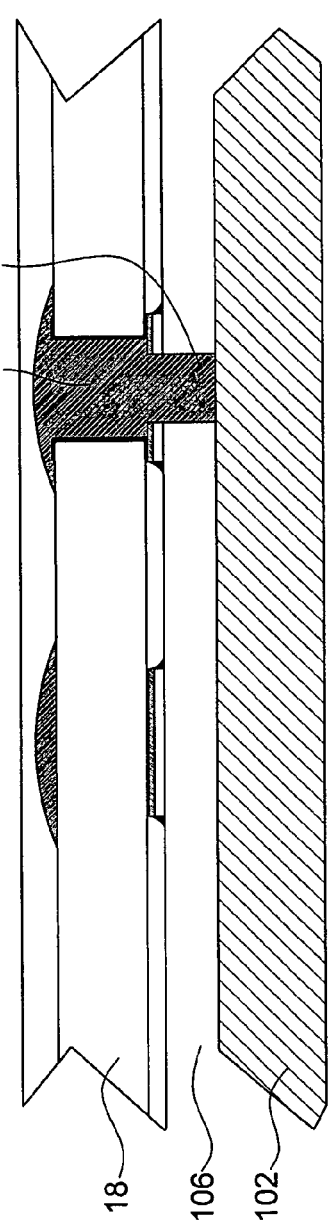

FIG. 11b shows an enlargement of an assembly of a resonator having recesses 58 and 60 on its central arm 18 and a package according to the second embodiment. When gluing, one fills in recesses 58 (not visible) and 60 with a conductive adhesive which excess flows down into recesses 120 (not visible) and 122.

Figure 11C:
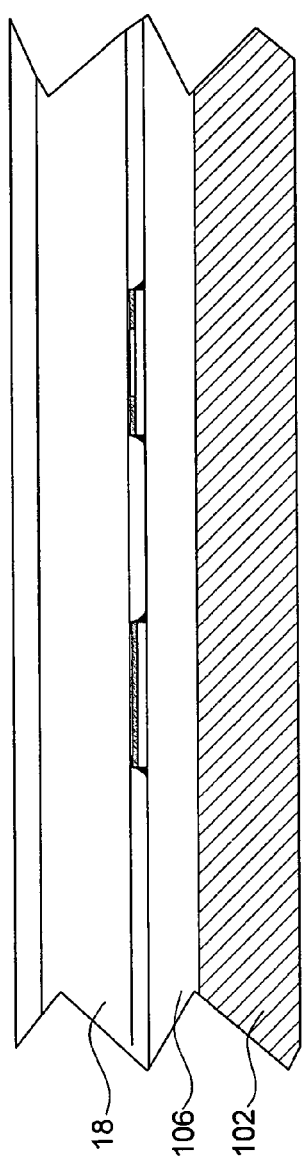

FIG. 11c shows an enlargement of an assembly of a resonator and a package according to the third embodiment. U-shaped barriers of bumps 124, 128a and 128b, respectively 126, 130a and 130b, prevents the excess of conductive adhesive from flowing towards the electrode located on resonator central arm 18.

Figure 11D:
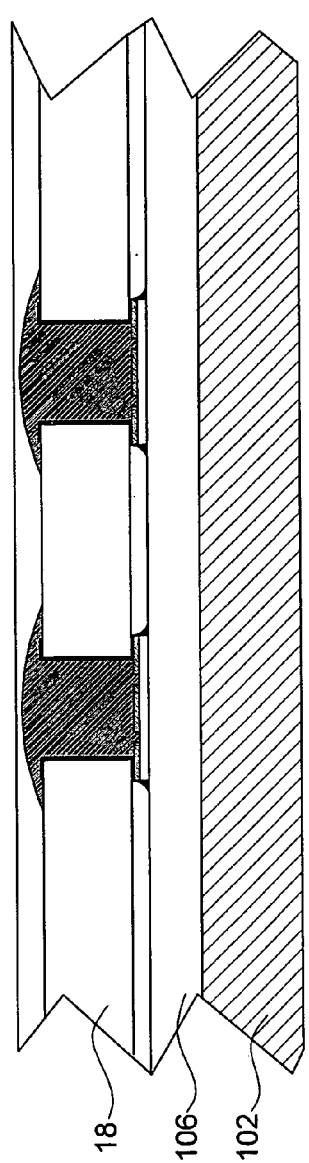

FIG. 11d shows an enlargement of an assembly of a resonator with holes and a package according to the sixth embodiment. The set of bumps configuration assures a uniform repartition of the conductive adhesive and therefore reduce unwanted leakage towards the electrode of the central arm.

Figure 11E:
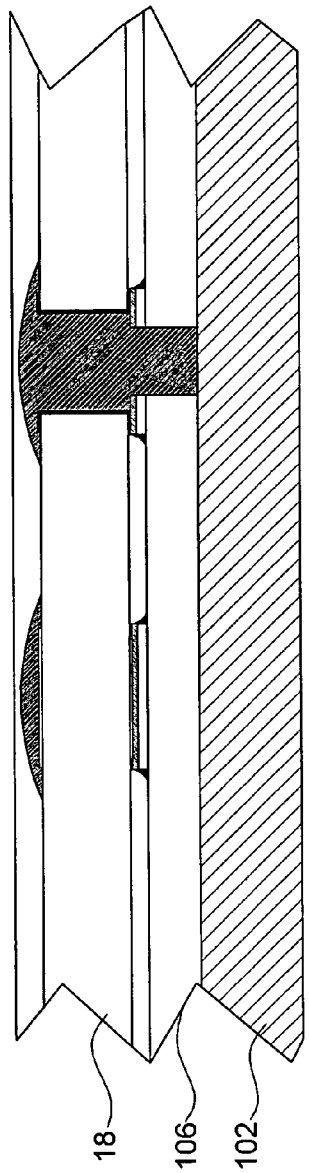

FIG. 11e shows an enlargement of an assembly of a resonator with recesses and a package according to a variant of the fourth embodiment. According to this embodiment the guiding means comprise not only a U-shaped barrier of bumps as in the third embodiment, but also recesses as in the second embodiment, both guiding means further preventing short-circuits due to conductive adhesive leakage.

Figure 11F:
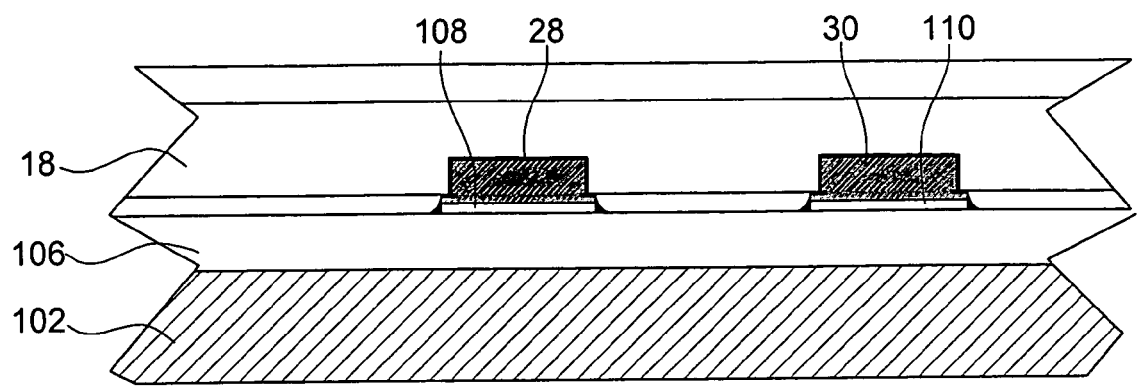
Figure 12:
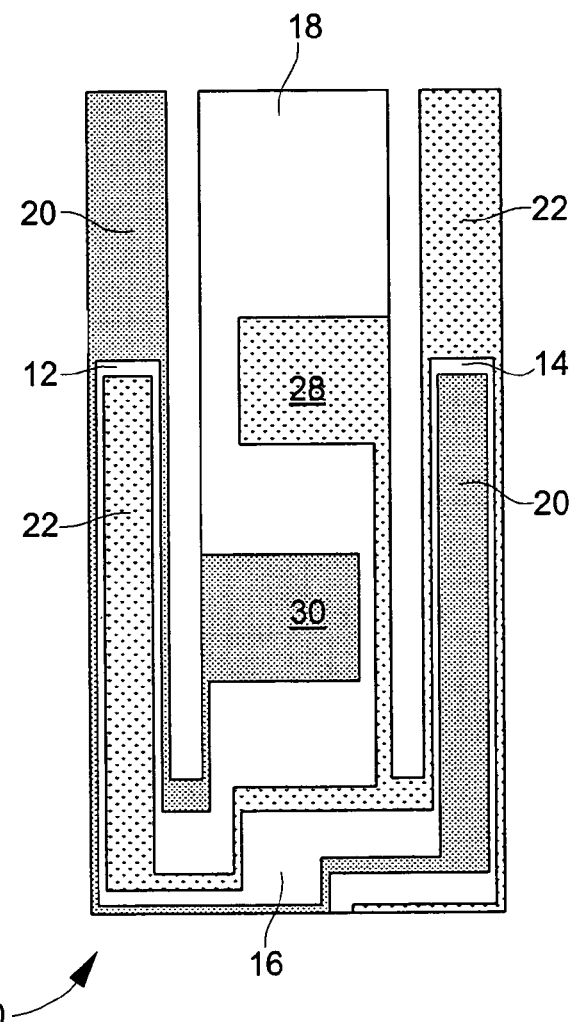
FIG. 12, already described, is a top view of a piezoelectric resonator according to the prior art.

FIG. 11f shows an enlargement assembly in the gluing zone of a resonator with blind holes and a package according the eighth embodiment. In this case, the guiding means are formed by blind holes 140 and 142, excess of the conductive adhesive being flown away in the cavities formed by these holes when mounting the resonator inside its package. Bumps may be provided in order to position said blind holes with respect to conductive pads 108 and 110.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims.

What is claimed is:

1. An assembly comprising a piezoelectric resonator and a case, said case including a main part with a bottom and sides, in which said resonator is mounted and a cover fixed to said main part, said resonator including a tuning fork shaped part with two parallel vibrating arms connected to each other by a linking part, and a central arm protruding from said linking part and located between both vibrating arms carrying at least two electrodes to make them vibrate, these two electrodes being connected respectively to at least first and second connection pads located on a back face of said central arm oriented toward the bottom of the case, said case further comprising at least one support secured to its bottom on which said central arm of the resonator is fixed by means of at least first and second connection elements located on said support and electrically connected respectively to said first and second connection pads by a conductive adhesive, wherein guiding means are provided at least with either said first connection pad or element being located on the linking part side in order to flow excess of said conductive adhesive away from the second electrode being not electrically connected to said first connection pad or element with said guiding means.

2. The assembly of claim 1, wherein said guiding means include a hole in said support through said first connection element.

3. The assembly of claim 1, wherein said guiding means include a recess cut in said support in a gluing zone of said first connection element and on the opposite side to the second electrode.

4. The assembly of claim 1, wherein said guiding means include at least one first bump arranged along either said first connection element or pad between the latter and said second electrode.

5. The assembly of claim 4, wherein said guiding means further include a hole in said support through said first connection element.

6. The assembly of claim 4, wherein said guiding means further include a recess cut in said support in a gluing zone of said first connection element and on the opposite side to the second electrode.

7. The assembly of claim 4, wherein said guiding means further include two other bumps arranged orthogonally to said first bump and along lateral sides of said first connection element or pad.

8. The assembly of claim 1, wherein guiding means are provided with both said first and second connection pads or elements.

9. The assembly of claim 1, wherein an opening through said first connection pad has been provided for positioning said resonator into said case.

10. The assembly of claim 9, wherein said opening is a hole which has been cut through said central arm.

11. The assembly of claim 9, wherein said opening is a recess which has cut on one side of said central arm facing one of said vibrating arms.

12. The assembly of claim 1, wherein an opening in the form of a blind hole has been cut in said first connection pad of said central arm.

13. The assembly of claim 8, wherein two openings through respectively said first and second connection pads have been provided for positioning said resonator into said case.

14. A method for securing a piezoelectric resonator in a case of an assembly according to claim 1, wherein said securing method comprises the following steps:
  gluing said connection pads respectively to said corresponding connection elements with said conductive adhesive;
  guiding away excess of said conductive adhesive from said second electrode by said guiding means.

15. The method of claim 14, wherein an opening through said first connection pad has been provided, the method comprising the preliminary step of positioning said resonator into said case by seeing said guiding means through said opening.

* * * * *